(12) United States Patent
Kang et al.

(10) Patent No.: US 9,473,180 B2
(45) Date of Patent: Oct. 18, 2016

(54) APPARATUS FOR CONVERTING FREQUENCY AND RF TRANSMITTER COMPRISING SAME

(71) Applicant: Electronics and Telecommunications Research Institute, Daejeon (KR)

(72) Inventors: Kyu Min Kang, Daejeon (KR); Seung Keun Park, Daejeon (KR); Jae Cheol Park, Daejeon (KR); Jung Sun Um, Daejeon (KR)

(73) Assignee: Electronics and Telecommunications Research Instit, Daejeon (KR)

( * ) Notice: Subject to any disclaimer, the term of this patent is extended or adjusted under 35 U.S.C. 154(b) by 0 days.

(21) Appl. No.: 14/946,255

(22) Filed: Nov. 19, 2015

(65) Prior Publication Data

US 2016/0149598 A1    May 26, 2016

(30) Foreign Application Priority Data

Nov. 20, 2014  (KR) .................. 10-2014-0162881

(51) Int. Cl.
*H04B 1/04* (2006.01)
*H04B 1/16* (2006.01)
*H04L 27/12* (2006.01)
*H03K 7/06* (2006.01)

(52) U.S. Cl.
CPC ........... *H04B 1/04* (2013.01); *H03K 7/06* (2013.01); *H04L 27/12* (2013.01)

(58) Field of Classification Search
CPC ................................ H04B 1/04; H04B 1/16
See application file for complete search history.

(56) References Cited

U.S. PATENT DOCUMENTS

| 5,369,800 A | * | 11/1994 | Takagi | ............... | H04B 7/12 |
| | | | | | 455/101 |
| 2010/0117693 A1 | * | 5/2010 | Lorg | ............... | H03D 7/163 |
| | | | | | 327/156 |
| 2011/0122831 A1 | | 5/2011 | Kim et al. | | |
| 2014/0016604 A1 | | 1/2014 | Lee | | |

FOREIGN PATENT DOCUMENTS

KR    1019990079918 A    11/1999

* cited by examiner

*Primary Examiner* — Nguyen Vo
(74) *Attorney, Agent, or Firm* — William Park & Associates Ltd.

(57) ABSTRACT

Disclosed is an apparatus for converting a frequency. The apparatus includes: an oscillator configured to generate a first oscillation signal having a first oscillation frequency which is obtained by subtracting an input frequency from a carrier frequency of any one carrier signal among a first to a n-th carrier signals (n is a natural number), and generate a second oscillation signal having a second oscillation frequency which is obtained by adding the input frequency to a carrier frequency of any one carrier signal among a (n+1)-th to a 2n-th carrier signals; and a mixer configured to mix and output the first oscillation signal or the second oscillation signal with an input signal having the input frequency.

9 Claims, 12 Drawing Sheets

$f_{L01} = f_{Ci} - f_{IF}$  ( $i = 1, 2, \cdots, n$ )
$f_{L02} = f_{Ci} + f_{IF}$  ( $i = n+1, \cdots, 2n$ )

$f_{LO1} = f_{Ci} - f_{IF}$ ($i = 1, 2, \cdots, n$)
$f_{LO2} = f_{Ci} + f_{IF}$ ($i = n+1, \cdots, 2n$)

$f_{LO1} = f_{Ci} - f_{IF}$ ( $i=1,2,\cdots,n$ )
$f_{LO2} = f_{Ci} + f_{IF}$ ( $i=n+1,\cdots,2n$ )

APPARATUS FOR CONVERTING FREQUENCY AND RF TRANSMITTER COMPRISING SAME

CROSS-REFERENCE TO RELATED APPLICATION

This application claims the benefit of priority to Korean Patent Application No. 10-2014-0162881, filed on Nov. 20, 2014 in the Korean Intellectual Property Office, the disclosure of which is incorporated herein in its entirety by reference.

BACKGROUND OF THE INVENTION

1. Field of the Invention

The present disclosure relates to an apparatus for converting a frequency and a RF transmitter comprising the same.

2. Description of the Related Art

Recently, an unlicensed use for a TV channel which is vacant without being used regionally in a TV band is considered, and a study on a spectrum sharing technology is actively progressed globally in various frequency bands. That is, as the paradigm of a frequency sharing policy is changed, available frequency band is expected to be gradually expanded in comparison with the frequency band of an existing license type.

For example, in the case of TV White Space (TVWS) that is a vacant frequency band which is not used temporally and regionally by a first user in the TV band, a frequency band which is available in an Ultra High Frequency (UHF) band ranges from 470 MHz to 698 MHz. Thus, a frequency band in which a TV Band Device (TVBD) can operate is quite wide. This means that a system in which thirty-eight center frequencies are able to be selectively used with an interval 6 MHz in a total 228 MHz frequency band should be designed. Therefore, in the case of designing and manufacturing a RF system, a filter and a frequency converter and the like which are operable in a broadband are required.

SUMMARY OF THE INVENTION

The present disclosure has been made in view of the above problems, and an apparatus for converting a frequency which is operable in a broadband and a RF transmitter comprising the same.

In accordance with an aspect of the present disclosure, an apparatus for converting a frequency comprises: an oscillator configured to generate a first oscillation signal having a first oscillation frequency which is obtained by subtracting an input frequency from a carrier frequency of any one carrier signal among a first to a n-th carrier signals (n is a natural number), and generate a second oscillation signal having a second oscillation frequency which is obtained by adding the input frequency to a carrier frequency of any one carrier signal among a (n+1)-th to a 2n-th carrier signals; and a mixer configured to mix and output the first oscillation signal or the second oscillation signal with an input signal having the input frequency. The input frequency is an intermediate frequency. The mixer adds and outputs the input signal to the first oscillation signal. The mixer subtracts and outputs the input signal from the second oscillator signal.

In accordance with another aspect of the present disclosure, an RF transmitter comprises: an oscillator configured to generate a first oscillation signal having a first oscillation frequency which is obtained by subtracting an input frequency from a carrier frequency of any one carrier signal among a first to a n-th carrier signals (n is a natural number), and generate a second oscillation signal having a second oscillation frequency which is obtained by adding the input frequency to a carrier frequency of any one carrier signal among a (n+1)-th to a 2n-th carrier signals; a mixer configured to mix and output the first oscillation signal or the second oscillation signal with an input signal having the input frequency; and a filter configured to filter a signal output from the mixer. The filter is a band pass filter. The band pass filter has a bandwidth defined based on a product of a bandwidth of the input signal and the 2n (n is a natural number). The mixer adds and outputs the input signal to the first oscillation signal. The mixer subtracts and outputs the input signal from the second oscillator signal.

BRIEF DESCRIPTION OF THE DRAWINGS

The objects, features and advantages of the present disclosure will be more apparent from the following detailed description in conjunction with the accompanying drawings, in which.

DETAILED DESCRIPTION OF EXEMPLARY EMBODIMENTS

Exemplary embodiments of the present disclosure are described with reference to the accompanying drawings in detail. The same reference numbers are used throughout the drawings to refer to the same or like parts. Detailed descriptions of well-known functions and structures incorporated herein may be omitted to avoid obscuring the subject matter of the present disclosure.

Figure 1:
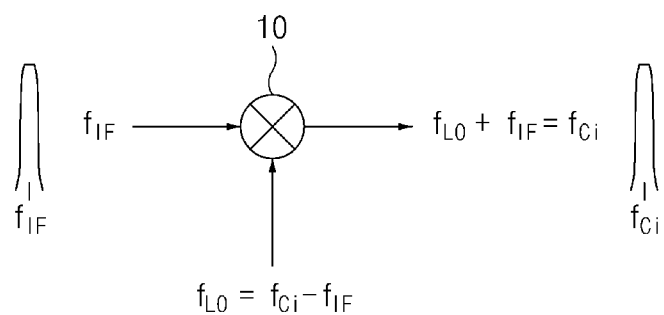
FIG. 1 is a diagram illustrating a frequency conversion process in a transmitter by using an addition characteristic of a mixer.

FIG. 1 is a diagram illustrating a frequency conversion process in a transmitter by using an addition characteristic of a mixer.

FIG. 1 illustrates a process of converting a frequency by using an addition characteristic of a mixer 10 in a process of converting an input signal having an intermediate frequency ($f_{IF}$) into a carrier signal having a carrier frequency ($f_{Ci}$, 1≤i≤n, n is a natural number).

When the input signal having an intermediate frequency ($f_{IF}$) is input, the mixer 10 may add the input signal having an intermediate frequency ($f_{IF}$) to an oscillation signal having an oscillation frequency ($f_{LO}=f_{Ci}-f_{IF}$) to output a carrier signal having a carrier frequency ($f_{Ci}$). The oscillation frequency may be determined on the basis of a desired frequency band (i.e., carrier frequency) for conversion.

Figure 2:
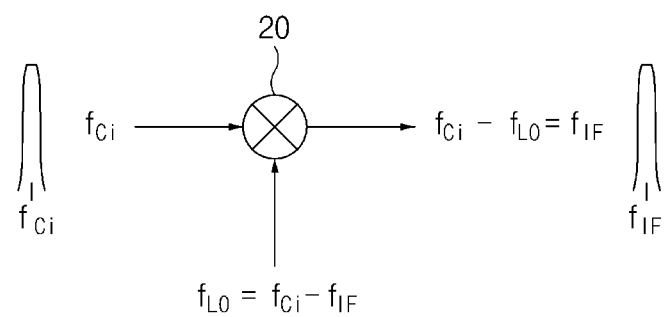
FIG. 2 is a diagram illustrating a frequency conversion process in a receiver by using a subtraction characteristic of a mixer.

FIG. 2 is a diagram illustrating a frequency conversion process in a receiver by using a subtraction characteristic of a mixer.

For ease of illustration, it is assumed that the frequency conversion process of FIG. 2 uses a signal which is received in a receiver after the frequency conversion process in the transmitter of FIG. 1.

Referring to FIG. 2, the input signal having a carrier frequency ($f_{Ci}$) may be received. In detail, FIG. 2 illustrates the frequency conversion process using a subtraction characteristic of a mixer 20 in the process of converting an input signal having a carrier frequency ($f_{Ci}$) into an output signal having an intermediate frequency ($f_{IF}$).

When the input signal having a carrier frequency ($f_{Ci}$) is input, the mixer 20 may subtract an oscillation signal having an oscillation frequency ($f_{LO}=f_{Ci}-f_{IF}$) from an input signal having a carrier frequency ($f_{Ci}$) to output an output signal having an intermediate frequency ($f_{IF}$).

Figure 3:
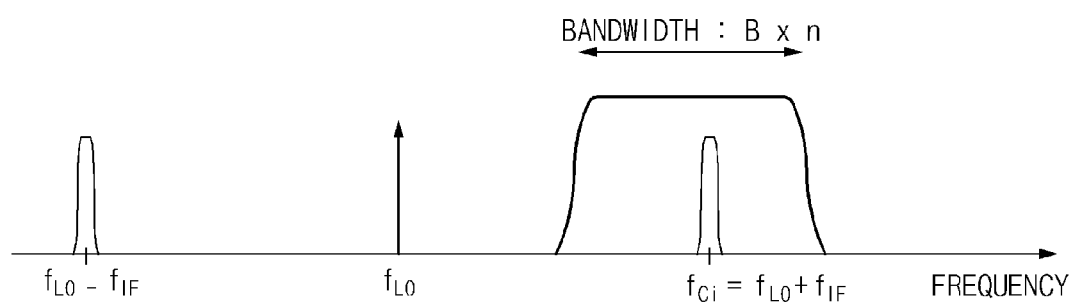
FIG. 3 and FIG. 4 illustrate a process of filtering an output signal of FIG. 1.
Figure 4:
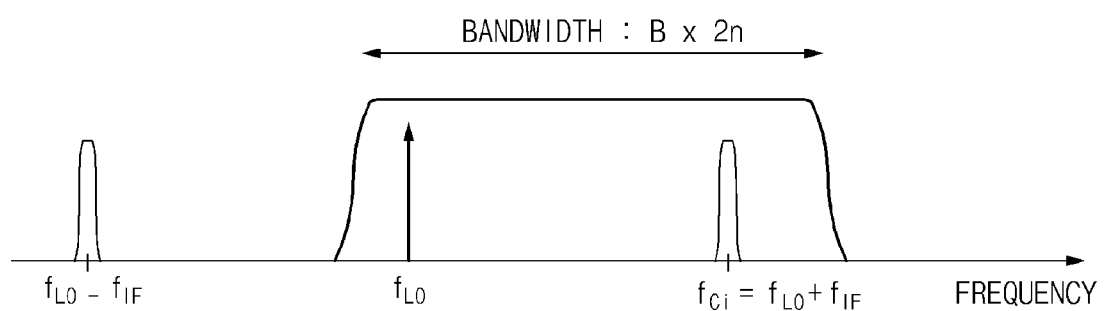

FIG. 3 and FIG. 4 illustrate a process of filtering an output signal of FIG. 1.

Referring to FIG. 3 and FIG. 4, the output signal which went through the frequency conversion process in a transmitter may be filtered by a band pass filter (not shown) and may be transmitted to a receiver.

In detail, FIG. 3 and FIG. 4 illustrate a process in which an output signal output through the frequency conversion process of FIG. 1 is filtered by a band pass filter (BPF). Hereinafter, for convenience of explanation, it is assumed that a frequency bandwidth of an input signal input to the mixer (10, see FIG. 1) is B, and it is assumed that an intermediate frequency ($f_{IF}$) is a value between B×n and B×2n. Here, n may indicate the number of carrier signal, and may be previously set.

First, FIG. 3 illustrate a process in which output signal components of the mixer 10 are filtered through a band pass filter of bandwidth B×n. An output signal of the mixer 10 may include a signal ($f_{LO}$) having an oscillation frequency and frequency band signals ($f_{LO}-f_{IF}$) corresponding to a difference between the oscillation frequency and the intermediate frequency, as well as a carrier signal ($f_{Ci}$) for use.

Therefore, a band-pass filter having a bandwidth B×n may be used in consideration of the skirt characteristic of the band-pass filter and the intermediate frequency ($f_{IF}$) in order to filter the carrier signal ($f_{Ci}$) for use. However, since the bandwidth of the band-pass filter is B×n, in the case of a signal having a bandwidth B, there is a limitation that a filtering may be performed only up to the carrier signal (i.e., $f_{Ci}$, i=1, 2, . . . , n) of maximum n band.

FIG. 4 illustrate a process in which output signal components of the mixer 10 are filtered through a band pass filter of bandwidth B×2n. Similarly to FIG. 3, an output signal of the mixer 10 may include a signal ($f_{LO}$) having an oscillation frequency and frequency band signals ($f_{LO}-f_{IF}$) corresponding to a difference between the oscillation frequency and the intermediate frequency, as well as a carrier signal ($f_{Ci}$) for use.

However, in the case of using a band-pass filter having a bandwidth B×2n wider than B×n as in FIG. 4, the oscillation signal having a oscillation frequency ($f_{LO}$) as well as the carrier signal for use ($f_{Ci}$) may pass through the band pass filter, accordingly, an undesired signal may occur in the transmitter.

Figure 5:
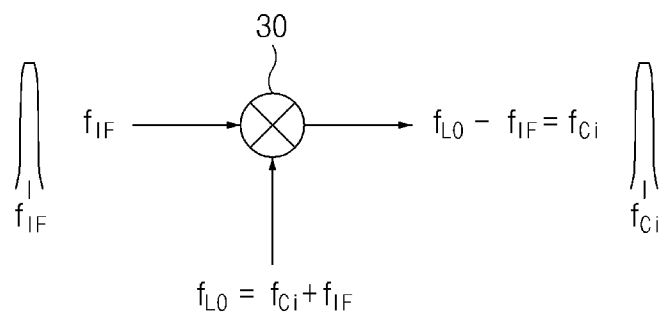
FIG. 5 is a diagram illustrating a frequency conversion process in a transmitter by using a subtraction characteristic of a mixer.

FIG. 5 is a diagram illustrating a frequency conversion process in a transmitter by using a subtraction characteristic of a mixer.

FIG. 5 illustrates a process of converting a frequency by using a subtraction characteristic of a mixer 30 in a process of converting an input signal having an intermediate frequency ($f_{IF}$) into a carrier signal having a carrier frequency ($f_{Ci}$, 1≤i≤n, n is a natural number).

When the input signal having an intermediate frequency ($f_{IF}$) is input, the mixer 30 may subtract the input signal having an intermediate frequency ($f_{IF}$) from an oscillation signal having an oscillation frequency ($f_{LO}=f_{Ci}+f_{IF}$) to output a carrier signal having a carrier frequency ($f_{Ci}$). The oscillation frequency may be determined based on a desired frequency band (i.e., carrier frequency) for conversion.

Figure 6:
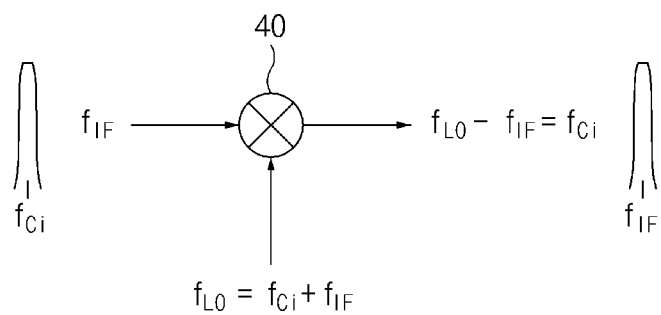
FIG. 6 is a diagram illustrating a frequency conversion process in a receiver by using a subtraction characteristic of a mixer.

FIG. 6 is a diagram illustrating a frequency conversion process in a receiver by using a subtraction characteristic of a mixer.

For ease of illustration, it is assumed that the frequency conversion process of FIG. 6 uses a signal which is received in a receiver after the frequency conversion process in the transmitter of FIG. 5.

Referring to FIG. 6, the input signal having a carrier frequency ($f_{Ci}$) may be received. In detail, FIG. 6 illustrates the frequency conversion process using a subtraction characteristic of a mixer 40 in the process of converting an input signal having a carrier frequency ($f_{Ci}$) into an output signal having an intermediate frequency ($f_{IF}$).

When the input signal having a carrier frequency ($f_{Ci}$) is input, the mixer 40 may subtract an input signal having a carrier frequency ($f_{Ci}$) from an oscillation signal having an oscillation frequency ($f_{LO}=f_{Ci}-f_{IF}$) to output an output signal having an intermediate frequency ($f_{IF}$).

Figure 7:
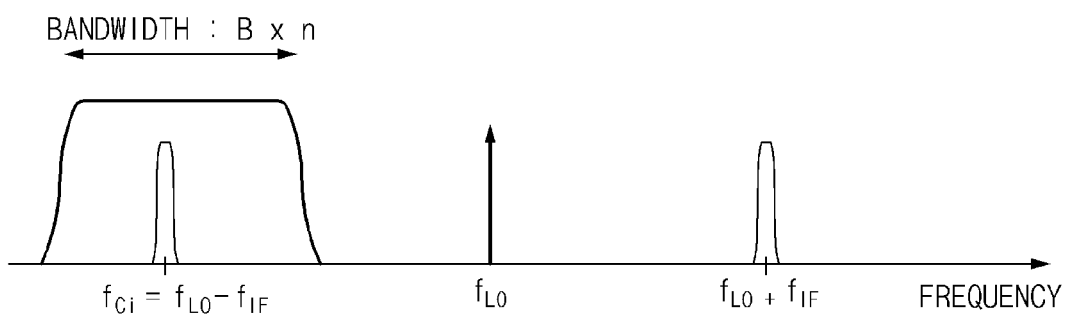
FIG. 7 and FIG. 8 illustrate a process of filtering an output signal of FIG. 5.
Figure 8:
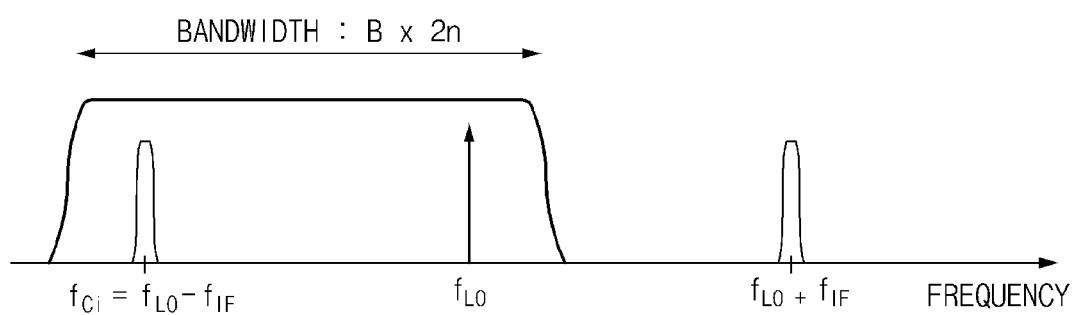

FIG. 7 and FIG. 8 illustrate a process of filtering an output signal of FIG. 5.

Referring to FIG. 7 and FIG. 8, the output signal which went through the frequency conversion process in a transmitter may be filtered by a band pass filter (not shown) and may be transmitted to a receiver.

In detail, FIG. 7 and FIG. 8 illustrate a process in which an output signal output through the frequency conversion process of FIG. 5 is filtered by a band pass filter (BPF). Hereinafter, for convenience of explanation, it is assumed that a frequency bandwidth of an input signal input to the mixer (30) is B, and it is assumed that an intermediate frequency ($f_{IF}$) is a value between B×n and B×2n. Here, n may indicate the number of carrier signal, and may be previously set.

First, FIG. 7 illustrate a process in which output signal components of the mixer (30, see FIG. 5) are filtered through a band pass filter having a bandwidth B×n. An output signal of the mixer 30 may include a signal ($f_{LO}$) having an oscillation frequency and frequency band signals ($f_{LO}+f_{IF}$) corresponding to a sum of the oscillation frequency and the intermediate frequency, as well as a carrier signal ($f_{Ci}$) for use.

Therefore, a band-pass filter having a bandwidth B×n may be used in consideration of the skirt characteristic of the band-pass filter and the intermediate frequency ($f_{IF}$) in order to filter the carrier signal ($f_{Ci}$) for use. However, similarly to the case of FIG. 3, since the bandwidth of the band-pass filter is B×n, in the case of a signal having a bandwidth B, there is a limitation that a filtering may be performed only up to the carrier signal (i.e., $f_{Ci}$, i=1, 2, ..., n) of maximum n band.

FIG. 8 illustrate a process in which output signal components of the mixer 30 are filtered through a band pass filter of bandwidth B×2n. Similarly to FIG. 7, an output signal of the mixer 30 may include a signal ($f_{LO}$) having an oscillation frequency and frequency band signals ($f_{LO}+f_{IF}$) corresponding to a sum of the oscillation frequency and the intermediate frequency, as well as a carrier signal ($f_{Ci}$) for use.

However, in the case of using a band-pass filter having a bandwidth B×2n wider than B×n as in FIG. 8, the oscillation signal having a oscillation frequency ($f_{LO}$) as well as the carrier signal for use ($f_{Ci}$) may pass through the band pass filter, accordingly, an undesired signal may occur in the transmitter.

As described above, generally, according to the frequency conversion process used in the transmitter and the receiver, in the case of using a band-pass filter having a bandwidth B×n, there is a limitation that a filtering can be performed only up to the carrier signal of the maximum n band. Further, in the case of using a band-pass filter having a bandwidth of B×2n in order to overcome such a limitation, undesired signal components may be filtered.

Figure 9:
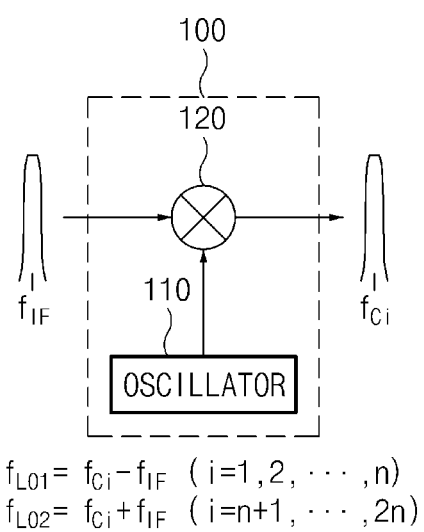
FIG. 9 is a diagram illustrating an apparatus for converting a frequency in a RF transmitter according to an embodiment of the present disclosure.

FIG. 9 is a diagram illustrating an apparatus for converting a frequency in a RF transmitter according to an embodiment of the present disclosure.

Referring to FIG. 9, an apparatus 100 for converting a frequency in a RF transmitter according to an embodiment of the present disclosure may include an oscillator 110 and a mixer 120.

The oscillator 110 may generate an oscillation signal. For example, the oscillator 110 may generate a first oscillation signal having a first oscillation frequency ($f_{LO1}$) which is obtained by subtracting an input frequency ($f_{IF}$) from a carrier frequency ($f_{Ci}$) of any one carrier signal among a first to a n-th carrier signals (n is a natural number), and may generate a second oscillation signal having a second oscillation frequency ($f_{LO2}$) which is obtained by adding the input frequency to a carrier frequency of any one carrier signal among a (n+1)-th to a 2n-th carrier signals. For example, the input frequency may be an intermediate frequency.

According to an aspect of the present disclosure, the oscillator 110 may generate the first oscillation frequency ($f_{LO1}$) of the first oscillation signal corresponding to a carrier signal having a first to a n-th carrier frequencies ($f_{Ci}$, i=1, 2, ..., n) as a frequency ($f_{LO1}=f_{Ci}-f_{IF}$, i=1, 2, ..., n) corresponding to a difference between the carrier frequency ($f_{Ci}$) and the input frequency ($f_{IF}$), and may generate the second oscillation frequency ($f_{LO2}$) of the second oscillation signal corresponding to a carrier signal having a (n+1)-th to a 2n-th carrier frequencies ($f_{Ci}$, i=n+1, n+2, ..., 2n) as a frequency ($f_{LO2}=f_{Ci}+f_{IF}$, i=n+1, n+2, ..., 2n) corresponding to a sum of the carrier frequency ($f_{Ci}$) and the input frequency ($f_{IF}$).

The mixer 120 may mix and output the first oscillation signal or the second oscillation signal which is transmitted from the oscillator 110 with the input signal having an input frequency. That is, when an input signal having a center frequency ($f_{IF}$) is input, the mixer 120 may subtract or add the input signal from the first oscillation signal or the second oscillation signal by considering a desired frequency band (i.e., $f_{Ci}$) for conversion and output the subtracted or added signal. For example, the mixer 120 may add and output the input signal to the first oscillation signal. In addition, the mixer 120 may subtract and output the input signal from the second oscillation signal.

Figure 10:
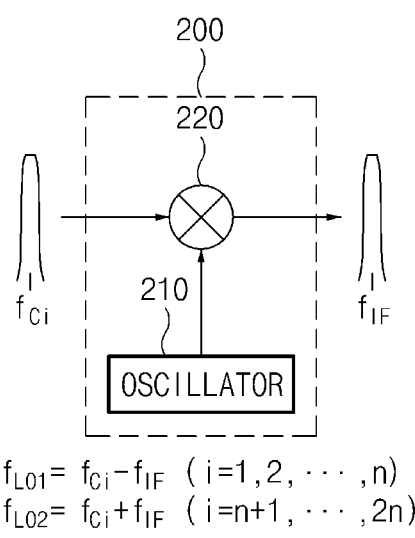
FIG. 10 is a diagram illustrating an apparatus for converting a frequency in a RF receiver according to an embodiment of the present disclosure.

FIG. 10 is a diagram illustrating an apparatus for converting a frequency in a RF receiver according to an embodiment of the present disclosure.

For ease of illustration, it is assumed that an apparatus 200 for converting a frequency of FIG. 10 receives a signal which is output from the apparatus 100 for converting a frequency of the transmitter of FIG. 9 after going through a filtering process. Further, a description substantially identical with FIG. 9 is omitted in order to avoid unnecessary duplication of description.

Referring to FIG. 10, an apparatus 200 for converting a frequency in a RF receiver according to an embodiment of the present disclosure may include an oscillator 210 and a mixer 220.

The oscillator 210 may generate an oscillation signal. For example, the oscillator 210 may generate a first oscillation signal having a first oscillation frequency ($f_{LO1}$) which is obtained by subtracting a intermediate frequency ($f_{IF}$) from a carrier frequency ($f_{Ci}$) of any one carrier signal among a first to a n-th carrier signals (n is a natural number), and may generate a second oscillation signal having a second oscillation frequency ($f_{LO2}$) which is obtained by adding intermediate frequency ($f_{IF}$) to a carrier frequency of any one carrier signal among a (n+1)-th to a 2n-th carrier signals.

The mixer 220 may mix and output the first oscillation signal or the second oscillation signal which is transmitted from the oscillator 210 with the input signal having an input frequency. That is, when an input signal having a center frequency ($f_{Ci}$) is input, the mixer 220 may subtract or add the input signal from the first oscillation signal or the second oscillation signal by considering a desired frequency band (i.e., $f_{IF}$) for conversion and output the subtracted or added signal. For example, the mixer 220 may subtract and output the input signal from the first oscillation signal or the second oscillation signal.

Figure 11:
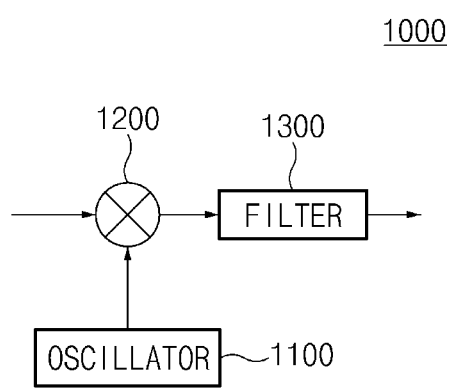
FIG. 11 is a diagram illustrating a RF transmitter according to an embodiment of the present disclosure.
Figure 12:
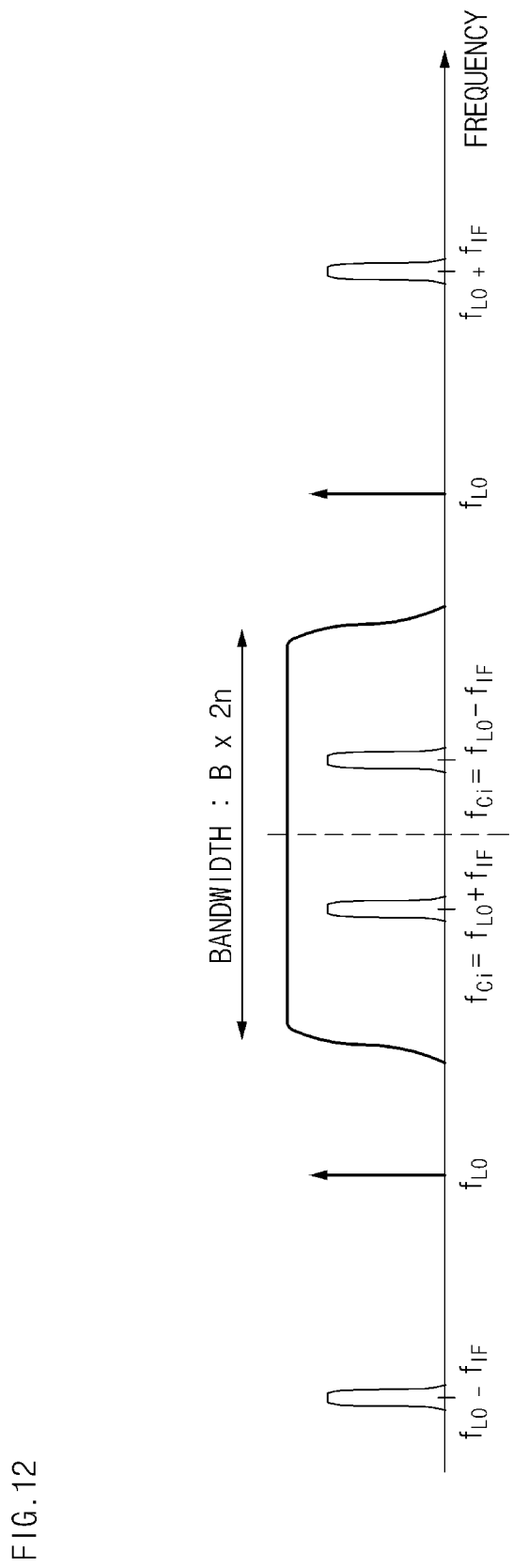
FIG. 12 is a diagram illustrating an operation of a RF transmitter according to an embodiment of the present disclosure.

FIG. 11 is a diagram illustrating a RF transmitter according to an embodiment of the present disclosure. FIG. 12 is a diagram illustrating an operation of a RF transmitter according to an embodiment of the present disclosure.

First, referring to FIG. 11, a RF transmitter 1000 according to an embodiment of the present disclosure may include an oscillator 1100, a mixer 1200, and a filter 1300.

The oscillator 1100 and the mixer 1200 may be respectively identical with the oscillator 110 and the mixer 120 described with reference to FIG. 9. Thus, hereinafter, a filter 1300 is mainly described.

The filter 1300 may filter a signal output from the mixer 1200. The filter 1300 may be, for example, a band-pass filter. The bandwidth of the filter 1300 may be defined as B×2n. Here, B may denote a frequency bandwidth of an input signal input to the mixer 1100, and n may denote the number of carrier signals.

Referring to FIG. 12, when the mixer 1200 outputs an output signal by mixing the input signal with the first oscillation signal (i.e., when outputting an output signal having a first to a n-th carrier frequencies), an output signal of the mixer 1200 may include a signal ($f_{LO}$) having an oscillation frequency and frequency band signals ($f_{LO}-f_{IF}$) corresponding to a difference between the oscillation frequency and the intermediate frequency, as well as a carrier signal ($f_{Ci}$) for use.

In addition, when the mixer 1200 outputs an output signal by mixing the input signal with the second oscillation signal (i.e., when outputting an output signal having a (n+1)-th to a 2n-th carrier frequencies), an output signal of the mixer 1200 may include a signal ($f_{LO}$) having an oscillation frequency and frequency band signals ($f_{LO}+f_{IF}$) corresponding to a sum of the oscillation frequency and the intermediate frequency, as well as a carrier signal ($f_{Ci}$) for use.

However, in RF transmitter 1000 according to an embodiment of the present disclosure, the oscillator 1100 may generate a first oscillation signal having a first oscillation frequency ($f_{LO1}$) which is obtained by subtracting a intermediate frequency ($f_{IF}$) from a carrier frequency ($f_{Ci}$) of any one carrier signal among a first to a n-th carrier signals (n is a natural number), and may generate a second oscillation signal having a second oscillation frequency ($f_{LO2}$) which is obtained by adding intermediate frequency ($f_{IF}$) to a carrier frequency of any one carrier signal among a (n+1)-th to a 2n-th carrier signals, and the mixer 1200 may mix and output the first oscillation signal or the second oscillation signal with the input signal, so that only a desired carrier signal can be passed by using the filter 1300 having a bandwidth B×2n.

As described above, when the apparatus 100 or 200 for converting a frequency shown in FIG. 9 and FIG. 10 is used in a transmitter or a receiver, only a desired carrier signal may be extracted even if the band-pass filter having a bandwidth B×2n is used.

Meanwhile, FIG. 11 illustrates only the RF transmitter 1000, but the RF receiver may also have the same structure as the RF transmitter 1000. However, in the case of the RF receiver, the apparatus 200 for converting a frequency shown in FIG. 10 and the filter (1300, see FIG. 11) may be included.

In the apparatus for converting a frequency and the RF transmitter including the same according to an embodiment of the present disclosure, the apparatus for converting a frequency may generate an oscillation signal by adding or subtracting the carrier frequency and the intermediate frequency, and may properly mix the oscillation signal generated according to the carrier frequency with the input signal, so that the number of bands of processable carrier signals may be significantly increased by designing a band pass filter having two times wider than an existing band pass filter into the RF transmitter or the RF receiver.

Further, in the apparatus for converting a frequency and the RF transmitter including the same according to an embodiment of the present disclosure, the hardware complexity may be maintained to be substantially identical with the existing structure and the carrier signal may be processed in a band two times wider than an existing band.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for converting a frequency, the apparatus comprising:
    an oscillator configured to generate a first oscillation signal having a first oscillation frequency which is obtained by subtracting an input frequency from a carrier frequency of any one carrier signal among a first to a n-th carrier signals (n is a natural number), and generate a second oscillation signal having a second oscillation frequency which is obtained by adding the input frequency to a carrier frequency of any one carrier signal among a (n+1)-th to a 2n-th carrier signals; and
    a mixer configured to mix and output the first oscillation signal or the second oscillation signal with an input signal having the input frequency.

2. The apparatus of claim 1, wherein the input frequency is an intermediate frequency.

3. The apparatus of claim 1, wherein the mixer adds and outputs the input signal to the first oscillation signal.

4. The apparatus of claim 3, wherein the mixer subtracts and outputs the input signal from the second oscillator signal.

5. An RF transmitter comprising:
    an oscillator configured to generate a first oscillation signal having a first oscillation frequency which is obtained by subtracting an input frequency from a carrier frequency of any one carrier signal among a first to a n-th carrier signals (n is a natural number), and generate a second oscillation signal having a second oscillation frequency which is obtained by adding the input frequency to a carrier frequency of any one carrier signal among a (n+1)-th to a 2n-th carrier signals;
    a mixer configured to mix and output the first oscillation signal or the second oscillation signal with an input signal having the input frequency; and
    a filter configured to filter a signal output from the mixer.

6. The RF transmitter of claim 5, wherein the filter is a band pass filter.

7. The RF transmitter of claim 6, wherein the band pass filter has a bandwidth defined based on a product of a bandwidth of the input signal and the 2n (n is a natural number).

8. The RF transmitter of claim 5, wherein the mixer adds and outputs the input signal to the first oscillation signal.

9. The RF transmitter of claim 5, wherein the mixer subtracts and outputs the input signal from the second oscillator signal.

* * * * *